(12) United States Patent
Hustad et al.

(10) Patent No.: US 9,127,113 B2
(45) Date of Patent: Sep. 8, 2015

(54) POLYSTYRENE-POLYACRYLATE BLOCK COPOLYMERS, METHODS OF MANUFACTURE THEREOF AND ARTICLES COMPRISING THE SAME

(75) Inventors: Phillip Dene Hustad, Manvel, TX (US); Peter Trefonas, III, Medway, MA (US); Frank Steven Bates, Saint Louis Park, MN (US); Marc Andrew Hillmyer, Minneapolis, MN (US); Justin Glenn Kennemur, Minneapolis, MN (US)

(73) Assignees: ROHM AND HAAS ELECTRONIC MATERIALS LLC, Marlborough, MA (US); DOW GLOBAL TECHNOLOGIES LLC, Midland, MI (US); UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 13/472,998

(22) Filed: May 16, 2012

(65) Prior Publication Data
US 2013/0306594 A1 Nov. 21, 2013

(51) Int. Cl.
C08L 53/00 (2006.01)
C08F 299/04 (2006.01)
C08F 297/02 (2006.01)

(52) U.S. Cl.
CPC ............ *C08F 299/04* (2013.01); *C08F 297/026* (2013.01)

(58) Field of Classification Search
USPC .......................................................... 525/94
See application file for complete search history.

(56) References Cited

U.S. PATENT DOCUMENTS

| | | | |
|---|---|---|---|
| 4,098,980 A * | 7/1978 | Markle et al. .................. | 526/201 |
| 2008/0003288 A1 | 1/2008 | Bromberg | |
| 2009/0253867 A1* | 10/2009 | Takahashi et al. ............ | 525/227 |
| 2010/0113698 A1 | 5/2010 | Walton et al. | |
| 2010/0311849 A1* | 12/2010 | Gonzalez Montiel et al. . | 521/48 |
| 2012/0228262 A1 | 9/2012 | Tanaka | |
| 2013/0210231 A1 | 8/2013 | Senzaki | |

OTHER PUBLICATIONS

Rowe-Konopacki et al., Macromolecules, 2007, 40, p. 879-888 (2007).*
Drockenmuller et al., Covalent Stabilization of Nanostructures: Robust Block Copolymer Templates from Novel Thermoreactive Systems, Journal of Polymer Science, Part A: Polymer Chemistry (2005), 43(5), p. 1028-1037.*
Bang, J; Jeong, U.; Ryu, D. Y.; Russell, T. P.; Hawker, C. J., "Block Copolymer Nanolithography: Translation of Molecular Level Control to Nanoscale Patterns" Adv. Mater. 2009, 21, 4769-4792.
Bates, F. S.; Fredrickson, G. H., "Block Copolymers-Designer Soft Materials" Phys. Today 1999, 52, 32-38.
Hadjichristidis, N.; Iatrou, H.; Pispas, S.; Pitsikalis, M. J., "Anionic Polymerization: High Vacuum Techniques" Polym. Sci. Part A: Polym. Chem. 2000, 38, (18), 3211-3234.
Hucul, D. A.; Hahn, S. F., "Catalytic Hydrogenation of Polystyrene" Adv Mater (Weinheim, Ger) 2000, 12, (23), 1855-1858.
Kennemur et al., "Synthesis, Thermodynamics, and Dynamics of Poly(4-tertbutylstyrene-b-methyl methacrylate)" Macromolecules, 2012, 45 (17), pp. 7228-7236.
Lee, J. Y.; Shiao, M. C.; Tzeng, F. Y.; Chang, C. H.; Tsai, C. K.; Tsai, J. C.; Lo, K. H.; Lin, S. C.; Ho, R. M., "Syndiotactic Polyallyltrimethylsilane-Based Stereoregular Diblock Copolymers: Syntheses and Self-Assembled Nanostructures" Macromolecules 2012, 45, 2720-2730.
Maheshwari, S.; Tsapatsis, M.; Bates, F. S., "Synthesis and Thermodynamic Properties of Poly(cyclohexylethylene-b-dimethylsiloxane-b-cyclohexylethylene)" Macromolecules 2007, 40, 6638-6646.
Olson, D. A.; Chen, L.; Hillmyer, M. A., "Templating Nanoporous Polymers with Ordered Block Copolymers" Chem. Mater. 2008, 20, 869-890.
Russell, T.P., Hjelm, R.P., Seeger, P.A., "Temperature Dependence of the Interaction Parameter of Polystyrene and Poly(methyl methacrylate)" Macromolecules 1990, 23, 890-893.
Wolf, J. H.; Hillmyer, M. A., "Ordered Nanoporous Poly(cyclohexylethylene)" Langmuir 2003, 19, (16), 6553-6560.
Zalusky, A. S.; Olayo-Valles, R.; Wolf, J. H.; Hillmyer, M. A., "Ordered Nanoporous Polymers from Polystyrene-Polylactide Block Copolymers" J Am Chem Soc 2002, 124, 12761-12773.
Zhao, Y.; Sivaniah, E.; Hashimoto, T., "SAXS Analysis of the Order-Disorder Transition and the Interaction Parameter of Polystyrene-block-poly(methyl methacrylate)" Macromolecules 2008, 41, 9948-9951.
"Flory-Fox Equation" Wikiepedia, http://en.wikipedia.org/wiki/Flory%E2%80%93Fox_equation; Date unknown; 3 pages.

* cited by examiner

*Primary Examiner* — Jeffrey Mullis
(74) *Attorney, Agent, or Firm* — Cantor Colburn LLP

(57) ABSTRACT

Disclosed herein is a block copolymer comprising a first block derived from a vinyl aromatic monomer; and a second block derived from an acrylate monomer; where a chi parameter that measures interactions between the first block and the second block is greater than or equal to about 0.05, when measured at 240° C. Disclosed herein too is a method comprising polymerizing a vinyl aromatic monomer to form a first block; and polymerizing a second block onto the first block to form a block copolymer; where the second block is derived by polymerizing an acrylate monomer; and where the block copolymer has a chi parameter of greater than or equal to about 0.05, when measured at 240° C.; where the chi parameter is a measure of interactions between the first block and the second block.

7 Claims, 4 Drawing Sheets

POLYSTYRENE-POLYACRYLATE BLOCK COPOLYMERS, METHODS OF MANUFACTURE THEREOF AND ARTICLES COMPRISING THE SAME

This disclosure is related to polystyrene-polyacrylate block copolymers, methods of manufacture thereof and to articles comprising the same. In particular, this disclosure is related to polystyrene-polyacrylate block copolymers used for improved nanolithography patterning.

Block copolymers form self-assembled nanostructures in order to reduce the free energy of the system. Nanostructures are those having average largest widths or thicknesses of less than 100 nanometers. This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating periodic nanoscale structures. While these block copolymer films can provide contrast at the nanometer scale, it is however often very difficult to produce copolymer films that can display periodicity at less than 20 nanometers. Modern electronic devices often utilize structures that have a periodicity of less than 20 nanometers and it is therefore desirable to produce copolymers that can easily display structures that have average largest widths or thicknesses of less than 20 nanometers, while at the same time displaying a periodicity of less than 20 nanometers.

Many attempts have been made to develop copolymers that have average largest widths or thicknesses of less than 20 nanometers, while at the same time displaying a periodicity of less than 20 nanometers. The following discussion details some of the attempts that have been made to accomplish this.

FIGS. 1A and 1B depict examples of lamella forming block copolymers that are disposed upon a substrate. The block copolymer comprises a block A and a block B that are reactively bonded to each other and that are immiscible with each other. The alignment of lamellae domains can be either parallel (FIG. 1A) or perpendicular (FIG. 1B) to the surface of a substrate surface upon which they are disposed. The perpendicularly oriented lamellae provide nanoscale line patterns, while there is no surface pattern created by parallel oriented lamellae.

Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Therefore, to form a useful pattern, control of the orientation of the self-assembled microdomains in the block copolymer is desirable.

The block copolymer is annealed with heat (in the presence of an optional solvent), which allows for microphase separation of the polymer blocks A and B at a temperature above the glass transition temperature and below the order to disorder transition temperature. The annealed film can then be further developed by a suitable method such as immersion in a solvent/developer or by reactive ion etching which preferentially removes one polymer block and not the other to reveal a pattern that is commensurate with the positioning of one of the blocks in the copolymer. While this method generates self-assembled films with a uniform spacing, it has not proved useful in continuously and uniformly generating self-assembled films having domain sizes of less than 20 nanometers with a periodicity of less than 20 nanometers.

Disclosed herein is a block copolymer comprising a first block derived from a vinyl aromatic monomer; and a second block derived from an acrylate monomer; where a chi parameter that measures interactions between the first block and the second block is greater than or equal to about 0.05, when measured at 240° C.

Disclosed herein too is a method comprising polymerizing a vinyl aromatic monomer to form a first block; and polymerizing a second block onto the first block to form a block copolymer; where the second block is derived by polymerizing an acrylate monomer; and where the block copolymer has a chi parameter of greater than or equal to about 0.05, when measured at 240° C.; where the chi parameter is a measure of interaction between the first block and the second block.

Figure 1:
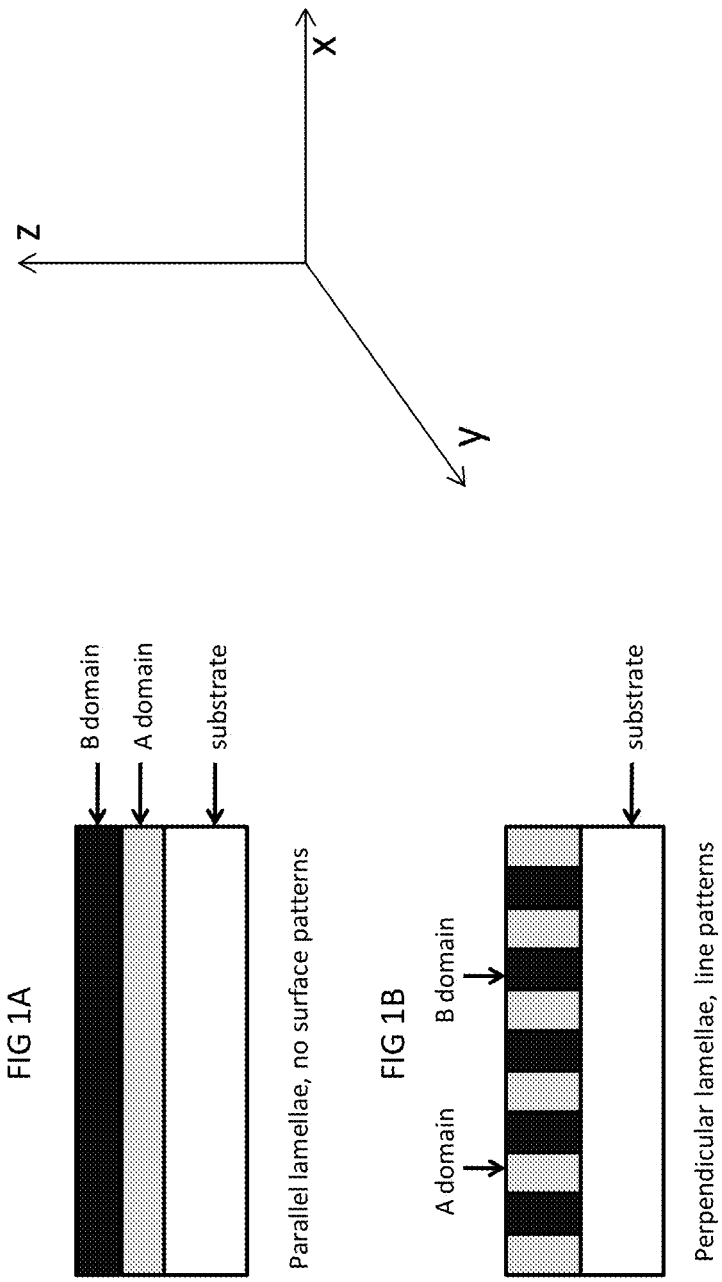
FIGS. 1A and 1B depict examples of lamella forming block copolymers that are disposed upon a substrate.

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 350° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first block and a second block that forms domains through phase separation that orient perpendicular to the substrate upon annealing. "Domain", as used herein, means a compact crystalline, semi-crystalline, or amorphous region formed by corresponding blocks of the block copolymer, where these regions may be lamellar or cylindrical and are formed orthogonal or perpendicular to the plane of the surface of the substrate and/or to the plane of a surface modification layer disposed on the substrate. In an embodiment, the domains may have an average largest dimension of about 1 to about 25 nanometers (nm), specifically about 5 to about 22 nm, and still more specifically about 5 to about 20 nm.

The term "$M_N$" used herein and in the appended claims in reference to a block copolymer of the present invention is the number average molecular weight of the block copolymer (in g/mol) determined according to the method used herein in the Examples.

The term "$M_W$" used herein and in the appended claims in reference to a block copolymer of the present invention is the weight average molecular weight of the block copolymer (in g/mol) determined according to the method used herein in the Examples.

The term "PDI" or "Đ" used herein and in the appended claims in reference to a block copolymer of the present invention is the polydispersity (also called polydispersity index or simply "dispersity") of the block copolymer determined according to the following equation:

$$PDI = \frac{M_W}{M_N}.$$

As used herein, PtBS-b-PMMA denotes block copolymers of poly(4-tert-butylstyrene) and polymethylmethacrylate. As used herein, PS-b-PMMA denotes block copolymers of polystyrene and polymethylmethacrylate.

The transition term "comprising" is inclusive of the transition terms "consisting of" and "consisting essentially of".

The term "and/or" is used herein to mean both "and" as well as "or". For example, "A and/or B" is construed to mean A, B or A and B.

Disclosed herein is a block copolymer comprising a first block polymer (hereinafter "first block" or "first block of the copolymer") and a second block polymer (hereinafter "second block" or "second block of the copolymer") in which the first and second block are chemically dissimilar and are characterized by an energetic penalty of dissolving one block into the other block. This energetic penalty is characterized by the Flory-Huggins interaction parameter or "chi" (denoted by $\chi$) and is an important factor in determining microphase segregation behavior in block copolymers. Accordingly, the $\chi$ value of a block copolymer defines a tendency of the block copolymer to segregate into microdomains as a function of the block copolymer's weight, chain length, and/or degree of polymerization. The chi parameter can often be approximated from the square of the difference in Hildebrand solubility parameters of the respective polymers of the block copolymer. In an exemplary embodiment, the chi parameter has a value of greater than or equal to about 0.1 at 240° C.

As used herein, the $\chi$ parameter denotes the segment-segment interaction parameter associated with a segment volume of 0.118 cubic nanometers ($nm^3$). The molecular weight of a segment, $m_o$, in units of g/mol is equal to the segment volume multiplied by the polymer density and divided by Avogadro's number. Also as used herein, the degree of polymerization, N, is defined as the number of segments per block copolymer molecule and $M_N = N \times m_o$.

A greater chi parameter between the first block of the copolymer with respect to the second block of the copolymer promotes the formation of smaller, highly periodic lamellar and/or cylindrical domains, which can be used to produce periodic structures in a substrate upon which the copolymer is disposed. In an exemplary embodiment, the periodic structures in the substrate are produced via nanolithography. In one embodiment, the first block of the copolymer is a block derived from a vinyl aromatic monomer while the second block of the copolymer is derived from an ethylenically unsaturated monomer. In one exemplary embodiment, the vinyl aromatic monomer is an alkylstyrene monomer, while the ethylenically unsaturated monomer is an alkyl methacrylate monomer. In another exemplary embodiment, the alkylstyrene monomer is 4-tert-butyl styrene, while the alkyl acrylate monomer is methyl methacrylate. In an exemplary embodiment, the first block of the copolymer is a poly(4-tert-butyl styrene), while the second block of the copolymer is polymethylmethacrylate. In one embodiment, the first block of the copolymer may contain a percentage (about 1 to about 50 mole percent) of polystyrenes other than poly(4-tert-butyl styrene), while the second block of the copolymer may contain a percentage (about 1 to about 50 mole percent) of polymethacrylates other than polymethylmethacrylate.

The first block of the copolymer and the second block of the copolymer both have a narrow polydispersity index and as a result form block copolymers that display a high degree of periodicity. The copolymers have lamellar and/or cylindrical morphologies and can align perpendicular to the surface of a substrate upon which they are disposed, thus making them useful for advanced semiconductor patterning. These block copolymers can be used for creating features on a substrate (upon which they are disposed) that are less than or equal to about 25 nanometers. The block copolymer can be further treated via annealing to self-assemble into morphologies that display improved long range order when compared with a comparative copolymer that has the same composition but is not annealed. This feature advantageously permits the block-copolymer to be used as a photoresist with variable interdomain spacings for different lithographic applications.

Disclosed herein too is a method for manufacturing the block copolymer. The method involves using controlled or living polymerization to synthesize the first block of the copolymer and the second block of the copolymer that have a narrow polydispersity index. The block copolymer can be manufactured by a number of different methods listed below.

In one exemplary embodiment, the block copolymer is manufactured using a sequential anionic polymerization technique where the first monomer is first anionically polymerized to form the first block. When the first block of the copolymer reaches a desired molecular weight, an endcapping agent is used to attenuate the reactivity of the polymeryl anion of the first block, after which the polymerization of the second block is initiated to form the block copolymer having a desired polydispersity index.

In another exemplary embodiment, the first block of the copolymer and the second block of the copolymer are polymerized separately and then chemically linked together via a covalent bond. In this method, the first block of the copolymer and the second block of the copolymer can be synthesized using different polymerization methods. In yet another embodiment, the block copolymer may be manufactured by sequential monomer addition using a controlled free radical polymerization technique. The sequential monomer addition strategies can be combined with controlled free radical techniques, including atom transfer radical polymerization (ATRP), reversible addition fragmentation chain transfer polymerization (RAFT), and other controlled polymerization methods. In short, the block copolymers can also be prepared by synthesis of the respective polymers (i.e., the first block of the copolymer and the second block of the copolymer) containing complementary chain-end functionalities and subsequently reacting these to form the block copolymers.

The block copolymer can be a multiblock copolymer. In one embodiment, the multiblocks can include diblocks, triblock, tetrablocks, and so on. The blocks can be part of a linear copolymer, a branched copolymer where the branches are grafted onto a backbone (these copolymers are also sometimes called "comb copolymers"), a star copolymer, or the like. In an exemplary embodiment, the block copolymer is a linear diblock copolymer.

The first block of the copolymer is a block derived from a vinyl aromatic monomer. The vinyl aromatic monomers that can be polymerized to produce the first block of the copolymer of the block copolymer are alkylstyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, monochlorostyrene, p-tert-butylstyrene, 4-tert-butylstyrene, or the like, or a combination comprising at least one of the foregoing alkylstyrene monomers. An exemplary alkylstyrene monomer is 4-tert-butylstyrene. An exemplary first block of the copolymer is poly(4-tertbutyl styrene). In one embodiment, the first block of the copolymer may contain about 2 to about 10 weight percent vinyl aromatic species that are not derived from 4-tert-butylstyrene.

The weight average molecular weight ($M_w$) of the first block is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min).

The polydispersity index of the first block is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The first block comprises about 20 to about 80 volume percent, specifically about 40 to about 60 volume percent, and more specifically about 45 to about 55 volume percent of the total volume of the copolymer. In an exemplary embodiment, the first block comprises about 50 volume percent of the total volume of the copolymer.

The second block of the copolymer is a block derived from an acrylate monomer. In one embodiment, the first repeat unit (i.e., the acrylate monomer) has a structure derived from a monomer represented by formula (1):

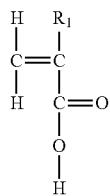

(1)

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, or the like, or a combination comprising at least one of the foregoing acrylates.

In one embodiment, the first repeat unit has a structure derived from a monomer having a structure represented by the formula (2):

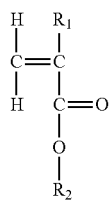

(2)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the alkyl (α-alkyl)acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates.

As noted above, the second repeat unit is derived from a monomer that has at least one fluorine atom substituent and has a structure represented by the formula (3):

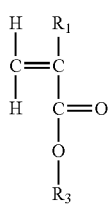

(3)

where $R_1$ is a hydrogen or an alkyl group having 1 to 10 carbon atoms and $R_3$ is a $C_{2-10}$ fluoroalkyl group. Examples of compounds having the structure of formula (3) are trifluoroethyl methacrylate, and dodecafluoroheptylmethacrylate. An exemplary monomer for the second block of the copolymer is methyl methacrylate. An exemplary second block of the copolymer is polymethylmethacrylate. It is to be noted that the second block of the copolymer may contain about 2 to about 5 weight percent acrylate species that are not derived from methylmethacrylate.

The weight average molecular weight ($M_w$) of the second block is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min). The polydispersity index of the second block is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min). The polydispersity index is used to determine the number average molecular weight of the respective blocks or of the entire block copolymer as desired. In order to convert a weight average molecular weight to a number average molecular weight, the weight average molecular weight as measured by gel permeation chromatography (GPC) instrument using THF as the mobile phase at a flow of 1 milliliter per minute (mL/min) is divided by the polydispersity index as determined by size exclusion chromatography (SEC) with chloroform as the mobile phase (at 35° C. and a flow rate of 1 mL/min).

The second block comprises about 20 to about 80 volume percent, specifically about 40 to about 60 volume percent, and more specifically about 45 to about 55 volume percent of the total volume of the copolymer. In an exemplary embodiment, the second block comprises about 50 volume percent of the total volume of the copolymer.

The polydispersity index of the block copolymer is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min).

The weight average molecular weight of the block copolymer is about 3 to about 150, specifically about 7.5 to about 120, specifically about 10 to about 100, and more specifically about 15 to about 70 kilograms per mole as determined using multi-angle laser light scattering gel permeation chromatography and the polydispersity index. In an exemplary embodiment, it is desirable for the block copolymer to have a weight average molecular weight of about 3 to about 120 kilograms per mole.

The block copolymer has an interdomain spacing as measured by small angle xray scattering of less than or equal to about 40 nanometers, specifically less than or equal to about 32 nanometers, more specifically less than or equal to about 25 nanometers, and more specifically less than or equal to about 20 nanometers.

The block copolymer can be manufactured in a batch process or in a continuous process. The batch process or the continuous process can involve a single or multiple reactors, single or multiple solvent and single or multiple catalysts (also termed initiators). In one embodiment, in one method of manufacturing the block copolymer, a first monomer is polymerized anionically to form the first block of the copolymer in a first reactor in the presence of a first solvent and a first initiator. A first endcapping agent is then introduced into the first reactor to quench the anionic reaction in the first reactor and to prevent undesirable side reactions. The second monomer is anionically polymerized into the second block of the copolymer in the presence of a second solvent and a second initiator. The second block may be polymerized in a second reactor. When the second block has reached a desirable molecular weight, the reaction may be quenched using a second endcapping agent. The first block and the second block are then covalently bonded to form the block copolymer. In one embodiment, the first block and the second block are then copolymerized (i.e., chemically (covalently) bonded) to form the block copolymer in the first reactor or the second reactor. The first reactor, the first solvent and the first initiator can be the same or different from the second reactor, the second solvent and the second initiator.

In an exemplary embodiment, the first reactor is the same as the second reactor, the first solvent is the same as the second solvent and the first initiator is the same as the second initiator. In one embodiment, the first monomer is polymerized anionically to form the first block of the copolymer in the first reactor in the presence of the first solvent and the first initiator. A first end reactivity attenuating agent is then introduced into the first reactor to reduce the reactivity of the anion reaction in the first reactor and to prevent undesirable side reactions. In another embodiment, a reactivity accelerating agent may be introduced into the first reactor to increase the rate of the anionic reaction in the first reactor.

In one embodiment, the reactivity attenuating agent or the reactivity accelerating agent is added to the reactor to control the rate of the reaction (of the first block) to a value that is approximate to that of the rate of reaction for the second block.

The second monomer is then introduced into the first reactor and is anionically polymerized to form the second block that results in the formation of the block copolymer. The anionic polymerization to form the second block is conducted in the presence of the first solvent and the first initiator. In one exemplary embodiment, no additional first initiator is added to the first reactor. This method of copolymerization is termed sequential polymerization. An end capping agent is then introduced into the first reactor to end-cap the copolymer.

Suitable solvents for conducting the reaction are polar solvents, non-polar solvents, or combinations thereof. Examples of solvents are aprotic polar solvents, polar protic solvents, or non polar solvents. In one embodiments, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such a benzene, alkylbenzenes (such as toluene or xylene), methylene chloride, carbon tetrachloride, hexane, diethyl ether, tetrahydrofuran, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is tetrahydrofuran.

The weight ratio of the solvent to the first monomer is about 5:1 to about 20:1, specifically about 7:1 to about 15:1, and more specifically about 8:1 to about 12:1.

In order to initiate polymerization of the first monomer to form the first block of the copolymer, it is desirable to use a first initiator that can initiate anionic polymerization of a vinyl aromatic compound. The first initiator is an aliphatic hydrocarbon alkali metal compound, an aromatic hydrocarbon alkali metal compound, an organic aminoalkali metal compound, or the like, or a combination comprising at least one of the foregoing first initiators.

Examples of the alkali metals include lithium, sodium, potassium, or the like, or a combination comprising at least one of the foregoing alkali metals. In an exemplary embodiment, the organic alkali metal compounds include an aliphatic and/or aromatic hydrocarbon lithium compound comprising 1 to about 20 carbon atoms, a compound comprising one lithium atom in a single molecule or dilithium, trilithium and tetralithium compounds comprising a plurality of lithium atoms in a single molecule.

In an exemplary embodiment, the first initiator is n-propyllithium, n-butyllithium, sec-butyllithium, tert-butyllithium, hexamethylenedilithium, butadienyldilithium, isoprenyldilithium, a reaction product of diisopropenylbenzene and sec-butyllithium, a reaction product of divinylbenzene, sec-butyllithium and a small amount of 1,3-butadiene, or the like, or a combination comprising at least one of the foregoing first initiators. An exemplary first initiator is sec-butyllithium.

In one embodiment, the first initiator is used in an amount of about 20 to about 2000 moles per mole of the first monomer. In an exemplary embodiment, the first initiator is used in an amount of about 70 to about 300 moles per mole of the first monomer.

The first monomer is reacted to form the first block of the copolymer at a temperature of about −100° C. to about 150° C., specifically about −80° C. to about 100° C. Reaction temperature is selected for the polymerization chemistry in order to minimize side reactions and provide polymer with narrow dispersity. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor.

In order to initiate polymerization of the second monomer to form the block copolymer, it is desirable to add the second monomer to the preformed polymeryl alkali metal compound of the vinyl aromatic compound. In one embodiment, the second monomer is used in an amount of about 20 to about 2000 moles per mole of the initiator. In an exemplary embodiment, the second monomer is used in an amount of about 70 to about 300 moles per mole of the initiator.

In one embodiment, the reaction to form the second block of the copolymer is conducted at a temperature of about −100° C. to about 150° C., specifically about −85° C. to about 100° C. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor. The reaction may also be conducted under a vacuum if desired.

In order to initiate polymerization of the second monomer to form the second block polymer, it is desirable to use a second initiator that can initiate anionic polymerization of a vinyl aromatic compound. The second initiator is optional, i.e., the first initiator may be used to polymerize both the first and the second block of the block copolymer. Examples of suitable initiators are organic alkali metal compounds of alkali metals such as lithium, sodium, potassium, rubidium, cesium, or francium. In one embodiment, the organic alkaline earth metal compounds are organometallic compounds of alkaline earth metals such as beryllium, magnesium, calcium, strontium, barium, or radium.

Examples of the second initiator are n-butyllithium, sec-butyllithium, tert-butyllithium, 1,1-diphenylhexyllithium, diphenylmethyllithium, 1,1-diphenyl-3-methylpentyllithium, fluorenyllithium, triphenylmethyllithium, α-lithiumethyl isobutyrate, oligostyryllithium, polystyryllithium, oligo-α-methylstyryllithium, poly-α-methylstyryllithium, oligobutadienyllithium, polybutadienyllithium, oligoisoprenyllithium, polyisoprenyllithium, and other monovalent organic lithium compounds; diphenylmethylpotassium, triphenylmethylpotassium, diphenylmethylsodium, triphenylmethylsodium, phenylmagnesium bromide, phenylmagnesium chloride, t-butylmagnesium bromide, t-butylmagnesium chloride, or the like, or a combination comprising at least one of the foregoing second initiators. An exemplary second initiator is 1,1-diphenylhexyllithium.

In one embodiment, the second initiator is used in an amount of about 0 to about 2000 moles per mole of the first monomer. In an exemplary embodiment, the second initiator is used in an amount of about 70 to about 300 moles per mole of the first monomer.

As noted above, after polymerization of the first block of the copolymer, it may be desirable to add a reactivity attenuating agent before adding the second monomer to prevent undesirable side reactions. A reactivity attenuating agent is then added to the reactor to modify the reactivity of the polymeryl alkali metal compound. An exemplary reactivity attenuating agent is 1,1-diphenylethylene. The reactivity attenuating agent is added to the reactor in an amount of about 1 to about 10 moles per mole of the initiator. In an exemplary embodiment, the reactivity attenuating agent is used in an amount of about 1.2 to about 1.5 moles per mole of the initiator. Additives, including metal salts such as LiCl, can also be added to improve the polydispersity of the polymer.

In one embodiment, it is it is desirable to quench the reaction when the second block of the copolymer has reached a desired molecular weight. The quenching is accomplished by addition of a protic compound. In a preferred embodiment, the quenching agent is degassed methanol. The quenching agent is added to the reactor in an amount of about 25 to about 1,000,000 moles per mole of the initiator. In an exemplary embodiment, the first endcapping agent is used in an amount of about 500 to about 20,000 moles per mole of the copolymer.

In one embodiment, the respective block polymers may be purified by a variety of methods prior to be reacted to form the block copolymer. Purification of the respective block polymers is optional. In another embodiment, the reactants, the respective block polymers, and the block copolymer may be purified prior to and after the reaction. Purification may include washing, filtration, precipitation, decantation, centrifugation, distillation, or the like, or a combination comprising at least one of the foregoing methods of purification.

In one exemplary embodiment, all reactants including the solvents, initiators and endcapping agents are purified prior to the reaction. It is generally desirable to use reactants, solvents and initiators that are purified to an amount of greater than or equal to about 99 wt % purity, specifically greater than or equal to about 99.5 wt % purity and more specifically greater than about or equal to about 99.9 wt % purity. In another exemplary embodiment, after sequential polymerization of the block copolymer, the block copolymer may be subjected to purification by methods that include washing, filtration, precipitation, decantation, centrifugation or distillation. Purification to remove substantially all metallic impurities and metallic catalyst impurities may also be conducted. The reduction of impurities reduces ordering defects when the block copolymers are annealed.

In one embodiment, the block copolymer can contain antioxidants, anti-ozonants, mold release agents, thermal stabilizers, levelers, viscosity modifying agents, free-radical quenching agents, other polymers or copolymers such as impact modifiers, or the like.

The block copolymer after purification may be dissolved in a solvent and then disposed upon the surface of a substrate to form a block copolymer film whose blocks are perpendicular in orientation to the surface of the substrate. In one embodiment, the surface of the substrate may contain a surface modification layer disposed thereon prior to the disposing of the block copolymer onto the surface of the substrate. The surface modification layer can be a block copolymer, a random copolymer, of a blend of homopolymers and form brushes on the surface of the substrate. The substrate can also be patterned such that some areas result in perpendicular orientation while others induce a parallel orientation of the block copolymer domains. The substrate can also be patterned such that some regions selectively interact, or pin, a domain of the block copolymer to induce order and registration of the block copolymer morphology. The substrate can also have topography that induces the alignment and registration of one or more of the domains of the block copolymer. The block copolymer of the invention after being disposed upon the substrate is optionally heated to a temperature of up to 350° C. for up to 4 hours to both remove solvent and form the domains in an annealing process. The annealing of the block copolymer can be used to vary the interdomain spacing (i.e., the periodicity) of the cylindrical and/or lamellar domains. The size of the domains can also be varied by annealing.

The domains of the block copolymer form perpendicular to the substrate and the first block aligns to the pattern created on the first domain to the "pinning" feature on the substrate, and the second block forms a second domain on the substrate aligned adjacent to the first domain. Where the patterned substrate forms a sparse pattern, and hence the surface modification layer regions are spaced at an interval greater than an interval spacing of the first and second domains, additional first and second domains form on the surface modification layer to fill the interval spacing of the sparse pattern. The additional first domains, without a pinning region to align to, instead align perpendicular to the previously formed perpendicular orientation inducing surface modification layer, and additional second domains align to the additional first domains.

One of the domains of the block copolymer (formed from either the first block of the copolymer or the second block of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The invention is further illustrated by the following non-limiting examples.

EXAMPLE 1

This example was conducted to demonstrate a method of manufacturing the block copolymer. The polymer manufactured herein is anionically polymerized. A series of symmetric poly(4-tert-butylstyrene-block-methyl methacrylate) (PtBS-b-PMMA) diblock copolymers with varying molar mass and narrow molar mass distribution were prepared using sequential anionic polymerization. Order-to-disorder transition (ODT) temperatures were determined as a function of the overall degree of polymerization, N, using a combination of low frequency dynamic mechanical spectroscopy (DMS) and variable temperature small-angle x-ray scattering (SAXS), leading to a mean-field expression for the segment-segment interaction parameter, $\chi=(41.2\pm0.9)/T-(0.044\pm0.002)$. This material is characterized by a larger value of $\chi$, and much greater temperature sensitivity, than polystyrene-b-PMMA, providing access to tunable lamellar periods (pitch) down to 14 nanometers (nm) at temperatures that can be easily reached.

4-tert-butylstyrene (tBS) (93%), methyl methacrylate (MMA) (>98.5%), 1,1-diphenylethylene (DPE) (97%), anhydrous methanol, sec-butyllithium (s-BuLi) (1.4 molar (M)) in hexane), dibutyl magnesium (DBMg) (1 M in heptane), n-butyllithium (n-BuLi) (2.5 M in hexanes), trioctylaluminum (TOA) (25 wt % in hexanes), and calcium hydride powder were purchased from Sigma-Aldrich. Deuterated chloroform (CDCl$_3$) was purchased from Cambridge Isotope Labs. Tetrahydrofuran (THF) was passed through a solvent purification system, which includes a column of activated alumina and a column of molecular sieves operated under a positive pressure of nitrogen gas Anhydrous methanol, employed to terminate anionic polymerizations, was sparged with dry nitrogen for 30 minutes prior to use to remove dissolved oxygen.

Linear diblock copolymers were synthesized using sequential anionic polymerization of tBS, end-capping of the PtBS block with DPE, subsequent polymerization of MMA, and finally termination of the polymerization using deoxygenated anhydrous methanol. Polymerizations were performed on a scale of ~20 grams (g) total monomer and 200 to 250 milliliters (mL) of THF solvent in a 1 liter (L) glass pressure reaction vessel containing five threaded ports. To three of the ports were attached PTFE stoppered flasks containing purified THF, tBS, and MMA all under argon. To the fourth port was attached a transfer/injection arm capable of varying the atmosphere within the vessel from high-vacuum (about 25 millitorr) to 5 pounds per square inch (psi) (0.35 kilograms per square centimeter) of dry argon through Cajon tube attachment to a manifold. This arm also contained two other inlets—one hosting a sealed septum for syringe injection of reagents and the other attached to a pressure gauge for monitoring pressure. The fifth port was plugged with a threaded polytetrafluoroethylene stopper. The assembled anionic reaction vessel was evacuated with high-vacuum of 25 mtorr and excessively flame dried followed by repetitious backfilling with argon, re-evacuating, and flame drying again. After the vessel was sufficiently dry and degassed, a dynamic pressure of 5 psi (0.35 kilograms per square centimeter) argon was then applied.

The temperature of the reaction was maintained at −78° C. throughout the polymerization through use of a dry ice/acetone bath. A representative polymerization procedure is as follows: After adequate preparation of the polymerization vessel described above, the stopper on the THF solvent flask was opened and about 200 mL was added to the flask and stirred using an egg-shaped polytetrafluoroethylene covered stirring magnet and a stir plate. The THF was then cooled to −78° C. Once cool, a predetermined amount of sec-butyllithium suitable for the desired molecular weight of the target polymer was injected into the cold THF using an air-tight syringe through the injection port arm on the vessel.

After stirring for 15 minutes, 8.998 g (56.1 mmol) of tBS monomer was then slowly added to the reaction vessel. After full monomer addition, the solution was allowed to stir at −78° C. for 1 hour. DPE, approximately 1.5 times the moles of sec-butyllithium initiator used, was then injected into the vessel through the injection septum and the polymerization solution turned from an orange to a deep red color.

Administering an excess of DPE ensures that all of the chains become capped. Only one unit of DPE is capable of addition as it cannot propagate due to steric restrictions. Following 15 minutes of stirring, a 1 to 2 mL aliquot was removed from the vessel using a long needle syringe and injected into ~15 to 20 mL of deoxygenated methanol to terminate and precipitate a small sample of the DPE capped PtBS homopolymer for characterization. Finally, to the bulk reaction, the MMA 11.386 g (113.7 mmol) was added slowly and anionic solution immediately became colorless. The MMA addition was allowed to stir for 1 hour. The polymerization was terminated with a 1-2 mL injection of degassed methanol. The vessel was depressurized, warmed to room temperature, disassembled, and the contents poured through a long stemmed funnel into a stirring solution of methanol (2 L, approximately 10 times the volume of the THF used). Precipitation of the white polymer occurred and was filtered, collected, and air dried to remove a majority of the methanol. It was then dissolved in 200 to 300 mL of THF. The precipitation and filtration procedure was then repeated. A final drying of the polymer at 40° C. in a vacuum oven for 3 days was then performed prior to further analysis. Greater than 97% polymer yield was recovered in all cases.

Dispersities (Đ) were determined by size exclusion chromatography (SEC) using HP 1100 series components, three successive Varian PLgel Mixed-C columns with chloroform as the mobile phase (at 35° C. and a flow rate of 1 mL/min) and eluents monitored using an HP 1047A RI detector. Values were determined based on a ten-point calibration curve using polystyrene standards purchased from Polymer Laboratories.

Weight average molecular weights (Mw) were determined using a separate gel permeation chromatography (GPC) instrument using THF as the mobile phase at a flow of 1 mL/min. The GPC is equipped with a Wyatt Technology DAWN DSP multi-angle laser light scattering (MALLS) detector in addition to a Wyatt Optilab EX RI detector. Size exclusion was performed with 3 successive Phenomenex Phenogel-5 columns and Mw values were determined from the dn/dc value of PtBS (0.129 mL/g) homopolymer reported in the literature. The volume fractions (f) of each block was calculated from the molar block fractions determined by $^1$H-NMR in CDCl$_3$ on a Varian Inova 500 MHz spectrometer with chemical shifts referenced from tetramethylsilane at 0.00 ppm. Molar fractions were obtained from integration comparison of the PtBS aryl protons versus the PMMA methoxy protons.

Glass transition temperatures (Tg) were determined using differential scanning calorimetry (DSC) on a TA Instruments Discovery DSC using T-zero aluminum pans. All BCP samples were heated to 220° C. at 20° C./min, cooled to 0° C. at 20° C./minute, then Tg was determined upon second heating at 20° C./minute. Thermogravimetric analysis (TGA) was performed on a Perkin Elmer Diamond TG/DTA under nitrogen atmosphere at a heating rate of 10° C./minute.

D-spacing values were obtained from SAXS analysis at 25° C. performed at the Advanced Photon Source (APS) at Argonne National Laboratory in Sector 5-ID-D beamline. The source produces X-rays with a wavelength of 0.73 Å.

Scattering intensities were monitored by a Mar 165 mm diameter CCD detector with a resolution of 2048×2048. Variable temperature (VT)-SAXS analysis was performed on a 2 meter instrument fitted with a Bruker Hi-Star multi-wire area detector, a Rigaku Ultrex 18 kilowatt (kW) generator with copper kα radiation x-rays of monochromatic wavelength=1.54 Å, and a thermally controlled sample chamber capable of accessing temperatures between 25 and 200° C. with direct thermocouple attachment to the sample stage.

Figure 2:
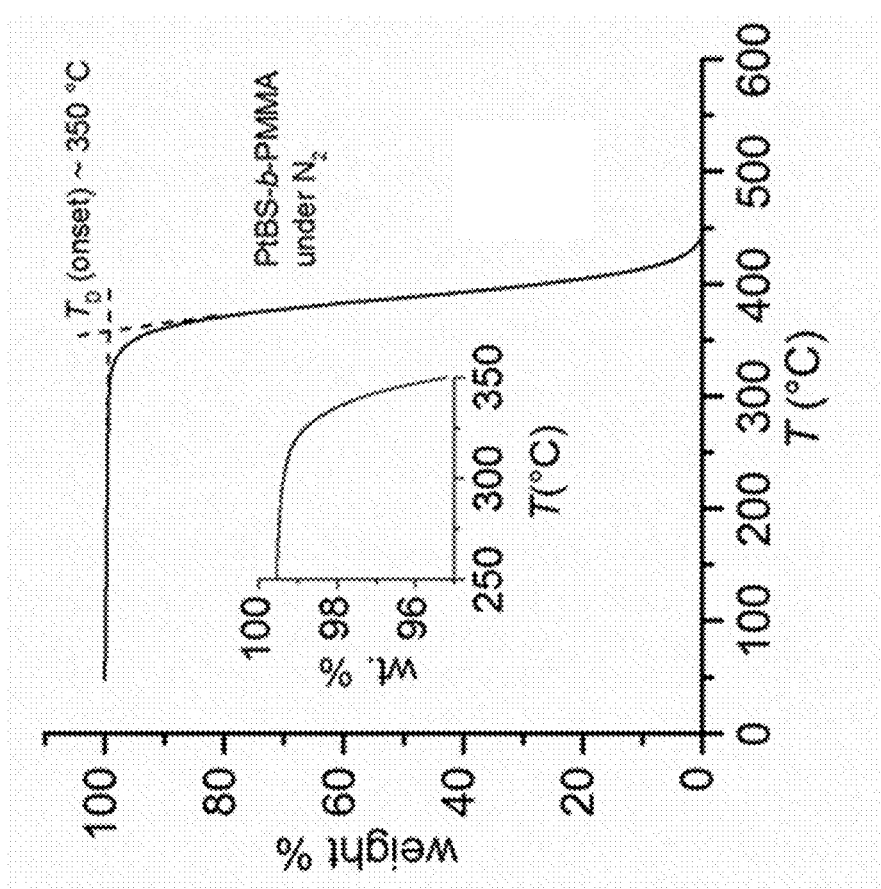
FIG. 2 is a graph depicting thermal decomposition data obtained using thermogravimetric analysis (TGA)
Figure 3:
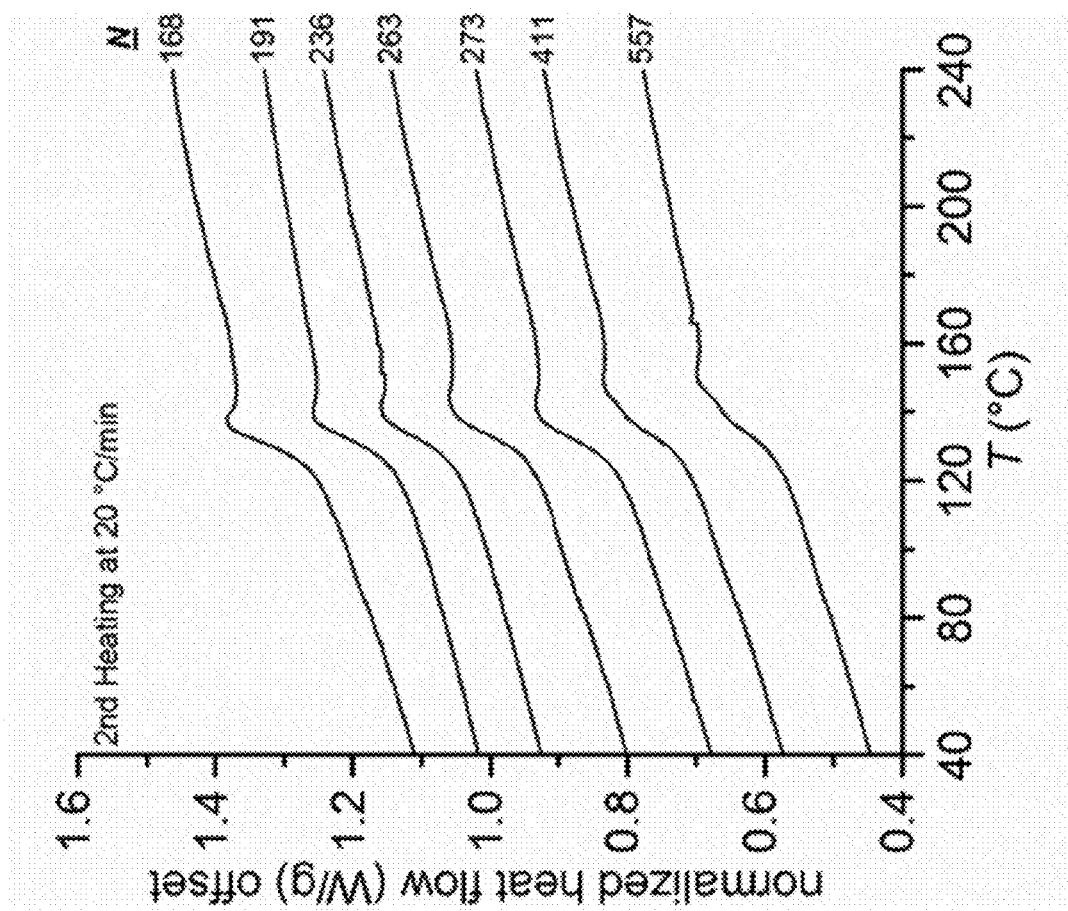
FIG. 3 is a graph depicting differential scanning calorimetry (DSC) thermograms for all of the compositions shown in the Table 1.

The resulting properties for the PtBS-b-PMMA block copolymers are detailed in Table 1. Calculation of the total degree of polymerization (N) was performed using the density values of PtBS (0.95 g/cm$^3$) and PMMA (1.18 g/cm$^3$) at 298° K and a reference volume, v$_0$, of 118 Å$^3$. For each block copolymer, the Mw of the PtBS block was determined from the homopolymer aliquot taken in-situ using MALLS-GPC and converted to M$_n$, using the dispersity, Đ. The total block copolymer M$_n$ was then determined from the molar ratio by 1H-NMR analysis. For all of the block copolymers, the composition (volume fraction fPtBS) lies between 0.50 and 0.55 with Đ being less than or equal to about 1.20. Thermal stability of PtBS-b-PMMA was tested by TGA under N$_2$ with heating from 30 to 600° C. at 10° C./min (FIG. 2). These materials demonstrate stability up to 325° C. and less than 5% weight loss up to 350° C. DSC reveals the T$_g$ for both blocks overlap within the range of 125 to 145° C. (FIG. 3). Although only one glass transition is observed at lower N values, two transitions are apparent at the higher molecular weights.

TABLE 1

| Sample # | Block Copolymer[a] | Mn (kg/mol)[b] | PDI[c] | f$_{PtBS}$[d] | N[e] | D (nm)[f] | T$_{ODT}$ (° C.) |
|---|---|---|---|---|---|---|---|
| 1 | PtBS-PMMA (12.5, 0.55) | 12.5 | 1.16 | 0.55 | 168 | 12.1[g] | |
| 2 | PtBS-PMMA (14.3, 0.53) | 14.3 | 1.14 | 0.53 | 191 | 12.4[g] | |
| 3 | PtBS-PMMA (17.6, 0.53) | 17.6 | 1.18 | 0.53 | 236 | 14.4 | 192 |
| 4 | PtBS-PMMA (19.6, 0.55) | 19.6 | 1.15 | 0.55 | 263 | 15.3 | 215 |
| 5 | PtBS-PMMA (20.5, 0.50) | 20.5 | 1.20 | 0.50 | 273 | 15.9 | 228 |
| 6 | PtBS-PMMA (31.1, 0.54) | 31.1 | 1.13 | 0.54 | 411 | 19.4 | 318 |
| 7 | PtBS-PMMA (41.6, 0.53) | 41.6 | 1.18 | 0.53 | 557 | 24.6 | |

[a]PtBS-PMMA(Y, Z) = PtBS-b-PMMA with a total molecular weight of Y (kg/mole) and a volume fraction of the PtBS block Z.
[b]Determined using multi-angle laser light scattering gel permeation chromatography (MALLS-GPC) of PtBS homopolymer and $^1$H-NMR molar ratio of each block.
[c]Dispersity determined through SEC analysis.
[d]PtBS volume fraction determined using the 25° C. densities ρ(PtBS) = 0.94 g/cm$^3$ and ρ(PMMA) = 1.18 g/cm$^3$.
[e]Total degree of polymerization based on 118 Å$^3$ reference volume (i0).
[f]Determined using 25° C. SAXS principle lamellar scattering peak q*, where D = 2π/q*.
[g]Denotes disordered morphology.

The data in Table 1 shows that for Sample #s 1 and 2 that have molecular weights of the blocks below 15 kilograms per mole, the samples have disordered morphologies. At molecular weights greater than 15 kilograms per mole, the block copolymer has an ordered structure with lamellae/cylinders. When cast as a thin film on a substrate, these lamella/cylinders are periodic and are perpendicular to the surface of the substrate. These samples can therefore be used for advanced semiconductor patterning.

The FIG. 2 is a graph depicting thermal decomposition data of Sample #4 obtained using thermogravimetric analysis (TGA). The heating in the TGA was conducted under nitrogen at a heating rate of 10° C./minute. TGA thermograms shown in the FIG. 2 show that the samples have a decomposition temperature of approximately 350° C., while the graph (inset) shows that the weight loss was less than 5 wt % prior to 350° C.

The FIG. 3 is a graph depicting differential scanning calorimetry (DSC) thermograms for all of the compositions shown in the Table 1. The DSC traces were obtained at a heating rate of 20° C./minute. The FIG. 3 that the samples display a glass transition temperature for both blocks between 125 and 145° C. The glass transition temperature for both individual blocks overlap, however, two phase transitions can be separately resolved as the value of N exceeds 400.

Figure 4:
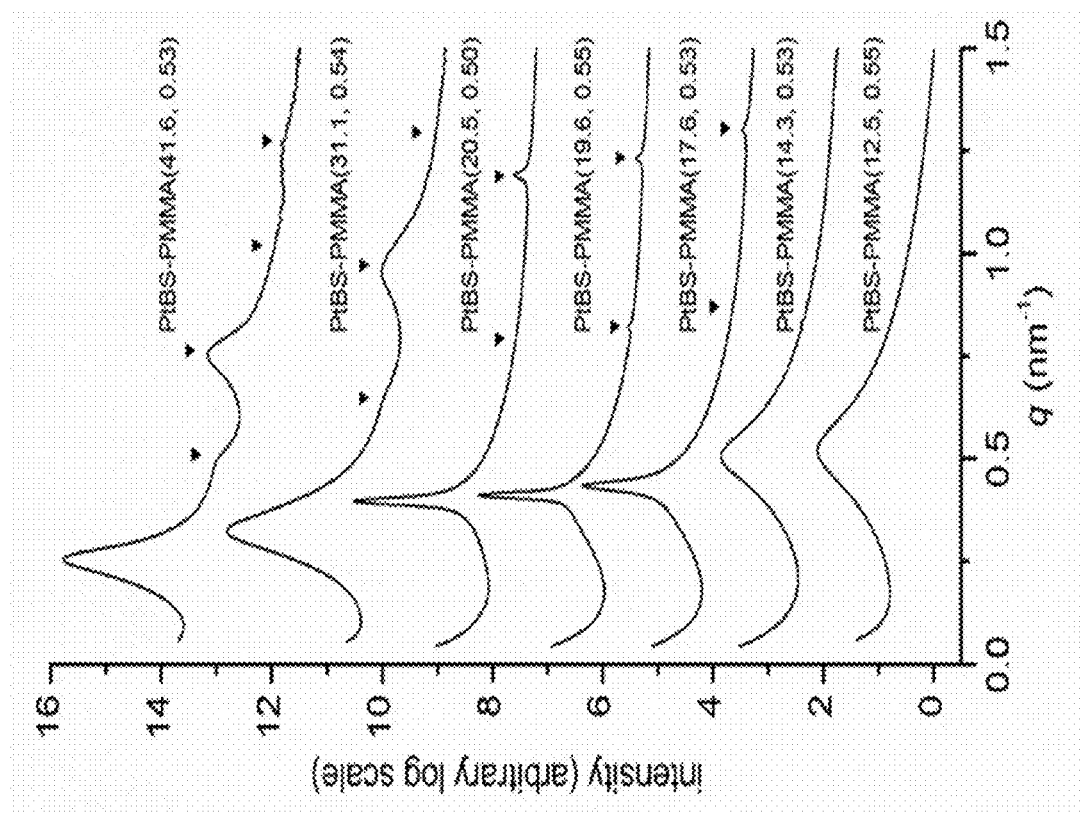
FIG. 4 is a graph depicting small angle xray scattering data (SAXS) for all of the compositions shown in the Table 1.

SAXS results obtained at 25° C. are presented in the FIG. 4. The domain spacing D=2π/q*, was determined for each specimen, where q* is the position of the principle (first-order) SAXS peak. Lower M$_n$ samples were prepared by annealing the bulk block copolymer under vacuum at 190° C. for 4 days. The two highest M$_n$ block copolymers were shear aligned through the use of a channel die in a melt press at 190° C. Although sample temperature during SAXS analysis was 25° C., it is believed that the observed pitch of the microdomains are close to those at 190° C. due to rapid cooling and vitrification of the samples after annealing.

The location of the higher order scattering peaks, with respect to q*, match those calculated (black triangles) for an anticipated lamellar morphology. The observation of a single broad principle peak for PtBS-PMMA (12.5,0.55) and PtBS-PMMA (14.3, 0.53) suggests the materials are disordered at 190° C. An ordered lamellar morphology for PtBS-b-PMMA (17.6, 0.53) is indicative of a larger χ when compared to symmetric polystyrene-block-polymethylmethacrylate (PS-b-PMMA) diblock copolymers, where M$_n$ at 30 kg/mole is required to obtain microphase separation at a comparable temperature. The secondary scattering peak located at 2q* is barely visible, consistent with the extinction condition for lamellar morphologies containing nearly equal volumes of each block.

EXAMPLE 2

This example demonstrates the difference between a block copolymer comprising polystyrene and polymethylmethacrylate (PS-b-PMMA) and a block copolymer comprising poly(4-tert-butyl-styrene) and polymethylmethacrylate (PtBS-b-PMMA). It also demonstrates the advantages of the block copolymer comprising poly(4-tert-butyl-styrene) and polymethylmethacrylate over a block copolymer comprising polystyrene and polymethylmethacrylate (PS-b-PMMA).

Current multiple patterning techniques can be used to form line/space patterns down to 20 nm pitch, but no practical method exists to form these patterns at a sub-20 nm pitch. PS-PMMA has been demonstrated to form these patterns at pitch down to 25 nm, but due to its relatively low $\chi$, PS-PMMA will not self assemble at a pitch below 21 nm. As demonstrated by the data, PtBS-PMMA can form self assembled structures as small as 14 nm and thus solves one important commercial issue with PS-PMMA in that it is extendable to small pitch where industry is currently desirous of a solution.

The block copolymer morphology is formed in part by the thermodynamic drive for the system to minimize interfacial area. A defect results in increased interfacial area. When $\chi$ is higher, the drive to minimize interfacial area is stronger, therefore the drive to eliminate defects is also higher, i.e., higher $\chi$ gives fewer defects at equilibrium.

At a given pitch, if a material has a higher $\chi N$, many other features related to the pattern will also be improved, including line-edge roughness. Below is a comparison of the interfacial width and line-edge roughness for PS-PMMA and PtBS=PMMA at 25 nm pitch. The relevant numbers such as periodicity are much lower for PtBS-PMMA (when compared with PS-b-PMMA) due to the higher $\chi$.

Some reports indicate that the self-assembly process can improve line width variations and line edge roughness (LER). However, theoretical and experimental evidence suggests that the inherent line-edge roughness of PS-PMMA block copolymer systems is not acceptable for semiconductor manufacturing at the 23 nm node. In this analysis, the LER was determined using transmission soft X-ray diffraction (SoXRD) from a line/space pattern formed by PS-PMMA and compared to predicted values of interfacial width and the interfacial variance.

The magnitude of the interfacial width, $\Delta$, was calculated as follows:

$$\Delta = \Delta_0 \left[1 + \frac{1.34}{\chi^{N^{1/3}}}\right], \Delta_0 = 2a_x\chi^{-0.5}/\sqrt{6}$$

where N is the total degree of polymerization, $\chi$ is the Flory interaction parameter, and $a_x$ is the statistical segment length. Variance in position of the interface $\langle \delta_x^2 \rangle$ was also calculated as follows:

$$\delta_x^2 = \frac{v6^{1/2}}{2\pi a_x \chi^{0.5}} \ln\left(\frac{d}{\Delta}\right)$$

where v is the monomer volume and d is the lamellar spacing or pitch (also termed periodicity). Accounting for the fluctuation-broadened interface, an apparent interfacial width, $\Delta_a$, can also be determined according to the equation:

$$\Delta_a^2 = \Delta^2 + 2\pi \langle \delta_x^2 \rangle$$

From these equations, these parameters can be compared for PS-b-PMMA and PtBS-b-PMMA. For PS-b-PMMA with d=25 nm, the interfacial width can be estimated to be $\Delta \approx 4.2$ nm, while the variance in the interface position is predicted to be $\langle \delta_x^2 \rangle \approx 0.9$ nm$^2$. These values can be combined to give an apparent interfacial width of $\Delta_a \approx 4.9$ nm. In contrast, at d=25 nm, PtBS-b-PMMA is predicted to have a much narrower interfacial width ($\Delta \approx 1.6$ nm) and variance in interfacial position ($\langle \delta_x^2 \rangle \approx 0.6$), giving an apparent interfacial width $\Delta_a$ of only 2.6 nm. The following physical parameters were used for these calculations: PS-b-PMMA: Mn=42.4 kg/mol, $\chi$=0.037 (at 240° C.), a=0.54 nm, characteristic ratio ($C_\infty$)=9.3, density ($\rho$)=0.962 g/cc, v=0.118 nm$^3$ and N=620; PtBS-b-PMMA: Mn=41.6 kg/mol, $\chi$=0.128 (at 240° C.), a=0.59 nm, $C_\infty$=10.3, $\rho$=1.051 g/cc, v=0.118 nm$^3$, and N=557.

This information shows that because of a larger chi parameter for PtBS-b-PMMA copolymers, the periodicity can be reduced to less than or equal to about 20 nanometers, specifically to less than or equal to about 15 nanometers. This is not achievable with PS-b-PMMA block copolymers. The larger chi parameter for PtBS-b-PMMA copolymers compared to PS-b-PMMA also leads to materials with sharper block interfaces (i.e. smaller interfacial widths) and lower line edge roughness.

From the aforementioned data it may be seen that when the chi parameter ($\chi$) is greater than or equal to about 0.05, specifically greater than or equal to about 0.075, specifically greater than or equal to about 0.1, and more specifically greater than or equal to about 0.12, the resulting block copolymer may have lamellar or cylindrical interdomain spacings (i.e., a periodicity) of less than or equal to about 25 nanometers, and specifically less than or equal to about 20 nanometers.

What is claimed is:

1. A block copolymer comprising:
   40 to 60 volume percent of a first block derived from a vinyl aromatic monomer; where the vinyl aromatic monomer is an alkylstyrene; where the alkylstyrene is o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, p-tert-butylstyrene, or a combination thereof; and where the first block has a polydispersity index of 1.2 or less; and
   40 to 60 volume percent of a second block derived from an acrylate monomer; where the acrylate monomer has a structure represented by the formula (2);

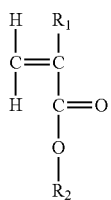
(2)

where $R_1$ is a hydrogen or an alkyl group having 1 to 10 carbon atoms and $R_2$ is a hydrogen, a $C_{1-10}$ alkyl, a $C_{3-10}$ cycloalkyl, a $C_{2-10}$ fluoroalkyl group, or a $C_{7-10}$ aralkyl group; where a chi parameter that measures interactions between the first block and the second block is greater than or equal to about 0.05, when measured at 240° C.; and where the second block has a polydispersity index of 1.2 or less; and where the block copolymer comprises cylindrical and/or lamellar domains and has an interdomain spacing of less than or equal to about 25 nanometers.

2. The block copolymer of claim 1, where the chi parameter is greater than or equal to 0.1.

3. The block copolymer of claim 1, where the acrylate monomer has a structure represented by formula (1):

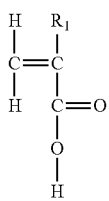

(1)

where $R_1$ is a hydrogen or an alkyl group having 1 to 10 carbon atoms.

4. The block copolymer of claim 1, where the acrylate monomer has a structure that comprises at least one fluorine atom substituent, where the structure represented by the formula (3):

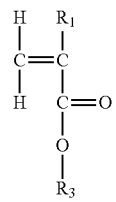

(3)

where $R_1$ is a hydrogen or an alkyl group having 1 to 10 carbon atoms and $R_3$ is a $C_{2-10}$ fluoroalkyl group.

5. The block copolymer of claim 1, where the first block is poly(p-tert-butylstyrene).

6. The block copolymer of claim 1, where the acrylate is methacrylate, ethacrylate, propyl acrylate, methyl methacrylate, propyl methacrylate, ethyl ethylacrylate, trifluoroethyl methacrylate, dodecafluoroheptylmethacrylate, or a combination thereof.

7. The block copolymer of claim 1, where the second block is polymethylmethacrylate.

* * * * *